(12) United States Patent
Kataoka

(10) Patent No.: US 11,532,608 B2
(45) Date of Patent: Dec. 20, 2022

(54) SEMICONDUCTOR DEVICE AND METHOD FOR MANUFACTURING SAME

(71) Applicant: KABUSHIKI KAISHA TOKAI-RIKA-DENKI-SEISAKUSHO, Aichi-ken (JP)

(72) Inventor: Yoshikazu Kataoka, Aichi-ken (JP)

(73) Assignee: KABUSHIKI KAISHA TOKAI-RIKA-DENKI-SEISAKUSHO, Aichi-Ken (JP)

( * ) Notice: Subject to any disclaimer, the term of this patent is extended or adjusted under 35 U.S.C. 154(b) by 0 days.

(21) Appl. No.: 17/260,702

(22) PCT Filed: Jul. 8, 2019

(86) PCT No.: PCT/JP2019/027015
§ 371 (c)(1),
(2) Date: Jan. 15, 2021

(87) PCT Pub. No.: WO2020/017383
PCT Pub. Date: Jan. 23, 2020

(65) Prior Publication Data
US 2021/0280573 A1    Sep. 9, 2021

(30) Foreign Application Priority Data

Jul. 18, 2018  (JP) .............................. JP2018-135262

(51) Int. Cl.
*H01L 27/02*    (2006.01)
*H01L 29/66*    (2006.01)
(Continued)

(52) U.S. Cl.
CPC .... *H01L 27/0255* (2013.01); *H01L 29/66393* (2013.01); *H01L 27/067* (2013.01);
(Continued)

(58) Field of Classification Search
CPC ............. H01L 27/0255; H01L 29/8611; H01L 29/861; H01L 29/87; H01L 21/76; H01L 21/822; H01L 27/04
See application file for complete search history.

(56) References Cited

U.S. PATENT DOCUMENTS

| 6,933,559 B1* | 8/2005 | Van Roijen ......... H01L 29/7816 257/E29.066 |
| 2009/0040670 A1* | 2/2009 | Van Camp .......... H01L 27/0255 361/91.5 |
| 2014/0048911 A1* | 2/2014 | Suzuki .................. H01L 29/063 257/629 |

FOREIGN PATENT DOCUMENTS

| JP | H 09-022997 | 1/1997 |
| JP | A 2008-153403 | 7/2008 |

(Continued)

OTHER PUBLICATIONS

PCT International Search Report (w/ English translation) and Written Opinion for corresponding PCT Application No. PCT/JP2019/027015, dated Sep. 3, 2019, 8 pages.

Primary Examiner — Wasiul Haider
(74) Attorney, Agent, or Firm — Dority & Manning, P.A.

(57) ABSTRACT

A semiconductor device including a protected element, a contact region, wiring, and a channel stopper region. The protected element is configured including a p-n junction diode between an anode region and a cathode region, and is arranged in an active layer of a substrate. The periphery of the diode is surrounded by an element isolation region. The contact region is arranged at a portion on a main face of the anode region, and is set with a same conductivity type as the anode region, and set with a higher impurity concentration than the anode region. The wiring is arranged over the diode. One end portion of the wiring is connected to the contact region and another end portion extends over a passivation (Continued)

film. The channel stopper region is arranged at a portion on the main face of the anode region under the wiring between the contact region and the element isolation region, and is set with an opposite conductivity type to the contact region.

5 Claims, 9 Drawing Sheets

(51) Int. Cl.
 *H01L 27/06* (2006.01)
 *H01L 29/74* (2006.01)
(52) U.S. Cl.
 CPC .......... *H01L 27/0676* (2013.01); *H01L 29/66* (2013.01); *H01L 29/6609* (2013.01); *H01L 29/7436* (2013.01)

(56) References Cited

FOREIGN PATENT DOCUMENTS

| | | |
|---|---|---|
| JP | A 2009-026987 | 2/2009 |
| JP | B 4354876 | 10/2009 |

\* cited by examiner

SEMICONDUCTOR DEVICE AND METHOD FOR MANUFACTURING SAME

CROSS-REFERENCE TO RELATED APPLICATIONS

This application is a national phase application of International Application No. PCT/JP2019/027015 filed on Jul. 8, 2019, which, in turn, is based upon and claims the right of priority to JP Patent Application No. 2018-135262 filed on Jul. 18, 2018, the disclosures of both of which are hereby incorporated by reference herein in their entirety for all purposes.

TECHNICAL FIELD

The present invention relates to a semiconductor device and a manufacturing method thereof, and in particular to effective technology applicable to a semiconductor device including a protected element and a manufacturing method thereof.

Background Art

Japanese Patent No. 4354876 discloses a semiconductor device adopting a silicon on insulator (SOI) substrate. The SOI substrate is formed as a layered structure including a silicon substrate, a buried oxide film on the silicon substrate, and a p-type active layer on the buried oxide film. A metal-oxide-semiconductor field-effect transistor (MOSFET) is formed on the p-type active layer.

Generally a silicon substrate of a SOI substrate is either in a floating state not applied with an electrical potential, or a ground potential is applied to the silicon substrate.

However, in cases in which a p-n junction diode having a high withstand voltage structure is formed on the p-type active layer of the SOI substrate as a protected element, an element isolation region is arranged surrounding the periphery of the p-n junction diode so as to electrically isolate the p-n junction diode from other elements. A trench isolation structure that reliably isolates the p-n junction diode from other elements is favorably employed as an element isolation region. Such an element isolation region is configured including a trench that extends from a surface of the p-type active layer to a buried oxide film, a silicon oxide film that is formed to side walls of the trench, and a polycrystalline silicon film that fills the trench such that the silicon oxide film is interposed between the polycrystalline silicon film and the trench.

An anode region of the p-n junction diode is connected to an external terminal through wiring, and a cathode region of the p-n junction is connected to internal circuitry through wiring. Since the anode region is generally formed by a p-type active layer set with a low impurity concentration, a contact region is interposed at the connection between the anode region and one end portion of the corresponding wiring. The contact region is formed by a p-type semiconductor region set with a higher impurity concentration than the anode region, enabling a connection resistance value with the one end portion of the wiring in the contact region to be reduced. Another end portion of the wiring extends over a passivation film formed on the p-n junction diode and is connected to the external terminal.

In the p-n junction diode surrounded by the element isolation region in this manner, when a negative surge voltage is applied to the anode region through the wiring, an accumulation layer is generated below the wiring at a portion on a main face of the anode region between the contact region and the element isolation region. This accumulation layer forms a region where a depletion layer does not spread from the element isolation region to the contact region within the anode region, and so there is room for improvement from the perspective of increasing the withstand voltage of the p-n junction diode.

SUMMARY OF INVENTION

Technical Problem

In consideration of the above circumstances, the present invention provides a semiconductor device and a manufacturing method thereof that are capable of easily increasing a withstand voltage of a protected element.

Solution to Problem

A semiconductor device according to a first aspect of the present invention includes a protected element, an element isolation region, a contact region, wiring, and a channel stopper region. The protected element is configured including a p-n junction diode between an anode region and a cathode region, and is arranged in an active layer of a substrate including the active layer formed over a substrate-support with an insulation layer interposed between the active layer and the substrate-support. The element isolation region is arranged in the active layer so as to surround a periphery of the p-n junction diode and to electrically isolate the p-n junction diode from an element arranged at the periphery of the p-n junction diode. The contact region is arranged at a portion on a main face of the anode region, is set with a same conductivity type as the anode region, and is set with a higher impurity concentration than the anode region. The wiring is arranged above the p-n junction diode with a passivation film between the p-n junction diode and the wiring. One end portion of the wiring is connected to the contact region and another end portion of the wiring extends over the passivation film. The channel stopper region is arranged on a portion on the main face of the anode region under the wiring between the contact region and the element isolation region, and is set with an opposite conductivity type to the contact region.

The semiconductor device according to the first aspect includes the protected element and the element isolation region on the substrate. The substrate includes the substrate-support, the insulation layer on the substrate-support, and the active layer on the insulation layer. The protected element is arranged in the active layer, and is configured including a p-n junction diode between the anode region and the cathode region. The element isolation region is arranged in the active layer so as to surround the periphery of the p-n junction diode. The element isolation region is electrically isolated from the element arranged at the periphery of the p-n junction diode.

Furthermore, the contact region is arranged at the main face portion of the anode region, and the one end portion of the wiring is connected to the contact region. The contact region is set with the same conductivity type as the anode region, and is set with a higher impurity concentration than the anode region. The wiring is arranged above the p-n junction diode with the passivation film between the p-n junction diode and the wiring, and the other end portion of the wiring extends over the passivation film.

The semiconductor device further includes the channel stopper region. The channel stopper region is arranged at the main face portion of the anode region and below the wiring between the contact region and the element isolation region. The channel stopper region is set with the opposite conductivity type to the contact region.

Thus even suppose that a negative surge voltage were to be applied through the wiring to the anode region, below the wiring on the main face portion of the anode region and between the contact region and the element isolation region, the generation of an accumulation layer can be effectively suppressed or prevented by the channel stopper region. Due to the generation of an accumulation layer being effectively suppressed or prevented, the depletion layer is able to spread from the element isolation region toward the contact region, enabling the junction withstand voltage of the p-n junction diode to be increased.

Furthermore, the junction withstand voltage of the p-n junction diode can be increased by a simple configuration in which the channel stopper region is simply arranged under the wiring at the main face portion of the anode region.

A semiconductor device according to a second aspect of the present invention is the semiconductor device according to the first aspect, wherein the wiring the channel stopper region is also arranged not under the wiring at a portion bordering a periphery of the contact region or surrounding the entire periphery of the contact region.

The semiconductor device according to the second aspect has the channel stopper region arranged bordering the peripheral portion of the contact region not below the wiring. Alternatively, the channel stopper region is arranged so as to surround the entire periphery of the contact region not below the wiring.

Thus, even were the electric field effect to spread in the width direction of the wiring, generation of an accumulation layer at the portion on the main face of the anode region in the region where this electric field effect has spread could be effectively suppressed or prevented compared to cases in which the channel stopper region is only arranged under the wiring. Thus, spreading of the depletion layer from the element isolation region toward the contact region can also be achieved even at a location not under the wiring, thereby enabling a still further increase to be achieved in the junction withstand voltage of the p-n junction diode.

A semiconductor device according to a third aspect of the present invention is the semiconductor device according to the first aspect, wherein the channel stopper region is arranged surrounding a periphery that extends around the anode region and the cathode region.

In the semiconductor device according to the third aspect, the channel stopper region is arranged surrounding the periphery around the anode region and the cathode region.

Thus in addition to the operation and advantageous effects obtained by the semiconductor device according to the second aspect, whichever layout arrangement is adopted for the other end portion of the wiring having one end portion connected to the contact region, the channel stopper region is always arranged under the wiring at a portion on the main face of the anode region. Namely, the degrees of freedom of the wiring layout can be increased while also being able to increase the junction withstand voltage of the p-n junction diode.

A semiconductor device according to a fourth aspect of the present invention is the semiconductor device according to any one of the first aspect to the third aspect, wherein the channel stopper region is set with a lower impurity concentration than the contact region, and is set with a higher impurity concentration than the anode region.

In the semiconductor device according to the fourth aspect, due to setting the channel stopper region with an impurity concentration lower than the impurity concentration of the contact region, the depth of the junction of the channel stopper region with the anode region is easily set deeper than the depth of the contact region.

Moreover, due to setting the channel stopper region with an impurity concentration higher than the impurity concentration of the anode region, the depth of the junction of the channel stopper region is easily set shallower than the depth of the anode region.

Thus the channel stopper region is formed along the side face on the anode region side of the element isolation region in a region at a depth deeper than the depth of the contact region, enabling the depletion layer in this deeper region to spread. This enables the junction withstand voltage of the p-n junction diode to be still further increased.

The semiconductor device according to the fifth aspect of the present invention is the semiconductor device according to any one of the first aspect to the fourth aspect, wherein a junction depth of the channel stopper region to the anode region is set deeper than a depth from the main face of the contact region.

In the semiconductor device according to the fifth aspect the junction depth of the channel stopper region to the anode region is set deeper than the depth from the main face of the contact region. This means that the channel stopper region is formed along the side face on the anode region side of the element isolation region in a region at a depth deeper than the depth of the contact region, enabling the depletion layer in this deeper region to spread. This enables the junction withstand voltage of the p-n junction diode to be still further increased.

The semiconductor device according to the sixth aspect of the present invention is the semiconductor device according to any one of the first aspect to the fifth aspect, wherein an impurity concentration of the channel stopper region is set the same as an impurity concentration of the cathode region, and a junction depth of the channel stopper region to the anode region is set the same as a junction depth of the cathode region to the anode region.

In the semiconductor device according to the sixth aspect the impurity concentration of the channel stopper region is set the same as the impurity concentration of the cathode region. Moreover, the junction depth of the channel stopper region to the anode region is set the same as a junction depth of the cathode region to the anode region. This means that the channel stopper region can easily be configured by the same structure as that of the cathode region, enabling the junction withstand voltage of the p-n junction diode to be increased simply.

A semiconductor device manufacturing method according to a seventh aspect of the present invention includes: a process of forming an element isolation region so as to surround a forming region for a p-n junction diode configuring a protected element in an active layer of a substrate including the active layer formed over a substrate-support with an insulation layer interposed between the active layer and the substrate-support, and of forming an anode region in the active layer such that a periphery of the anode region is surrounded by the element isolation region; a process of forming a cathode region having an opposite conductivity type to the anode region of the p-n junction diode on a portion on the main face of the anode region so as to form the p-n junction diode; a process of forming a contact region set with the same conductivity type as the anode region and set with a higher impurity concentration than the anode region on a different portion on the main face of the anode region to the portion formed with the cathode region; a process of forming wiring having one end portion connected to the contact region and another end portion extending over the p-n junction diode with a passivation film between the p-n junction diode and the wiring: and a process of forming a channel stopper region under the wiring at a portion on the main face of the anode region between the contact region and the element isolation region, such that the channel stopper region has the same conductivity type as the cathode region and is formed in the same process as the process of forming the cathode region.

In the semiconductor device manufacturing method according to the seventh aspect, first the element isolation region is formed on the substrate and the anode region of the p-n junction diode configuring the protected element is formed. The substrate includes the substrate-support, the insulation layer on the substrate-support, and the active layer on the insulation layer. The element isolation region is formed in the active layer so as to surround the periphery of the forming region for the p-n junction diode. The anode region is formed in the active layer such that a periphery of the anode region is surrounded by the element isolation region.

Next, the cathode region is formed at the main face portion of the anode region, and the p-n junction diode including the anode region and the cathode region is formed. The cathode region is set with the opposite conductivity type to the anode region.

The contact region is formed at the different portion on the main face of the anode region to the portion formed with the cathode region. The contact region is set with the same conductivity type as the anode region, and the impurity concentration of the contact region is set at a higher impurity concentration than the anode region.

Next, the wiring is formed above the p-n junction diode with the passivation film interposed therebetween. One end portion of the wiring is connected to the contact region, and the other end portion of the wiring extends above the passivation film.

The channel stopper region is formed at the main face portion of the anode region and under the wiring between the contact region and the element isolation region. The channel stopper region is formed with the same conductivity type as the cathode region by the same process as the process to form the cathode region.

This means that the channel stopper region is formed by utilizing the process to form the cathode region, enabling the number of manufacturing processes to be reduced by the elimination of an extra process to form the channel stopper region. Moreover, the junction withstand voltage of the p-n junction diode can still be increased.

Advantageous Effects

The present invention enables provision of a semiconductor device and a semiconductor device manufacturing method that are capable of easily increasing the withstand voltage of a protected element.

DESCRIPTION OF EMBODIMENTS

First Exemplary Embodiment

Figure 1:
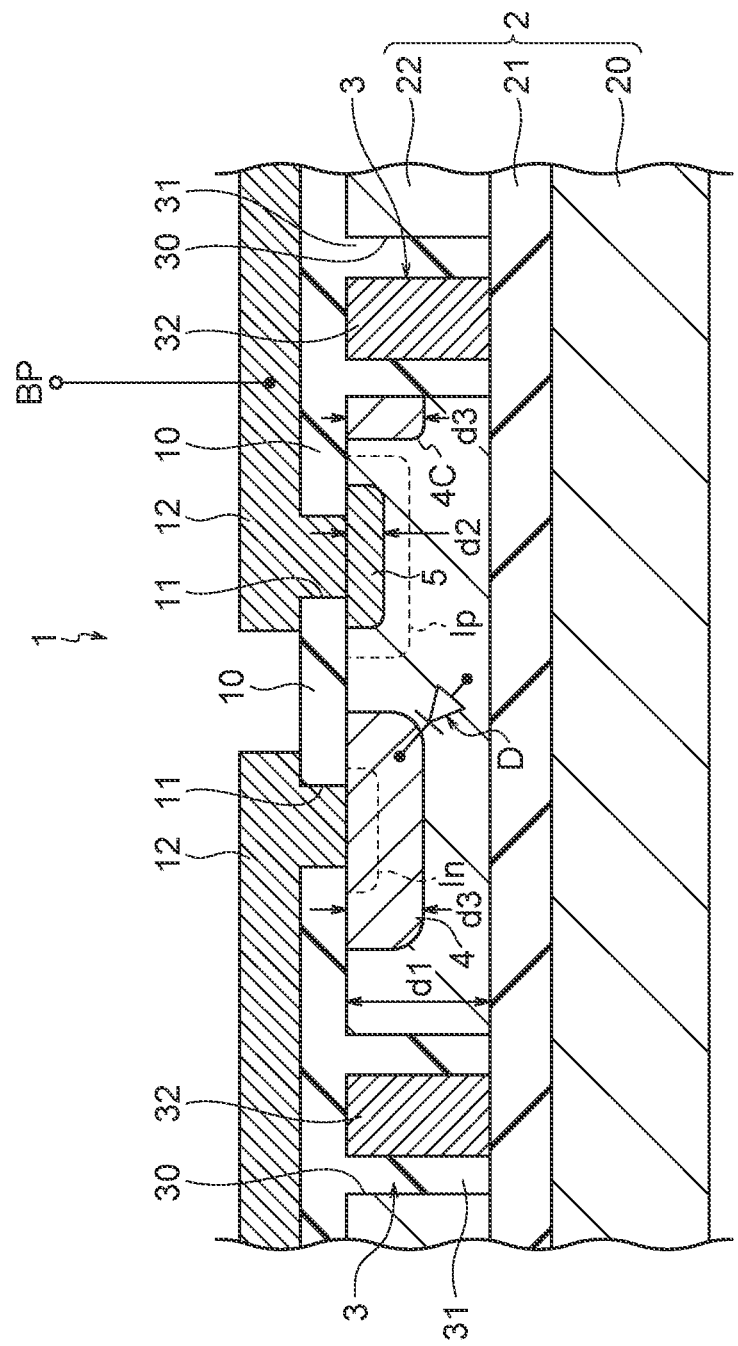
FIG. 1 is a vertical cross-section structural diagram (a cross-section sectioned along line A-A in FIG. 2) schematically illustrating an enlargement of relevant portions of a semiconductor device according to a first exemplary embodiment of the present invention.
Figure 2:
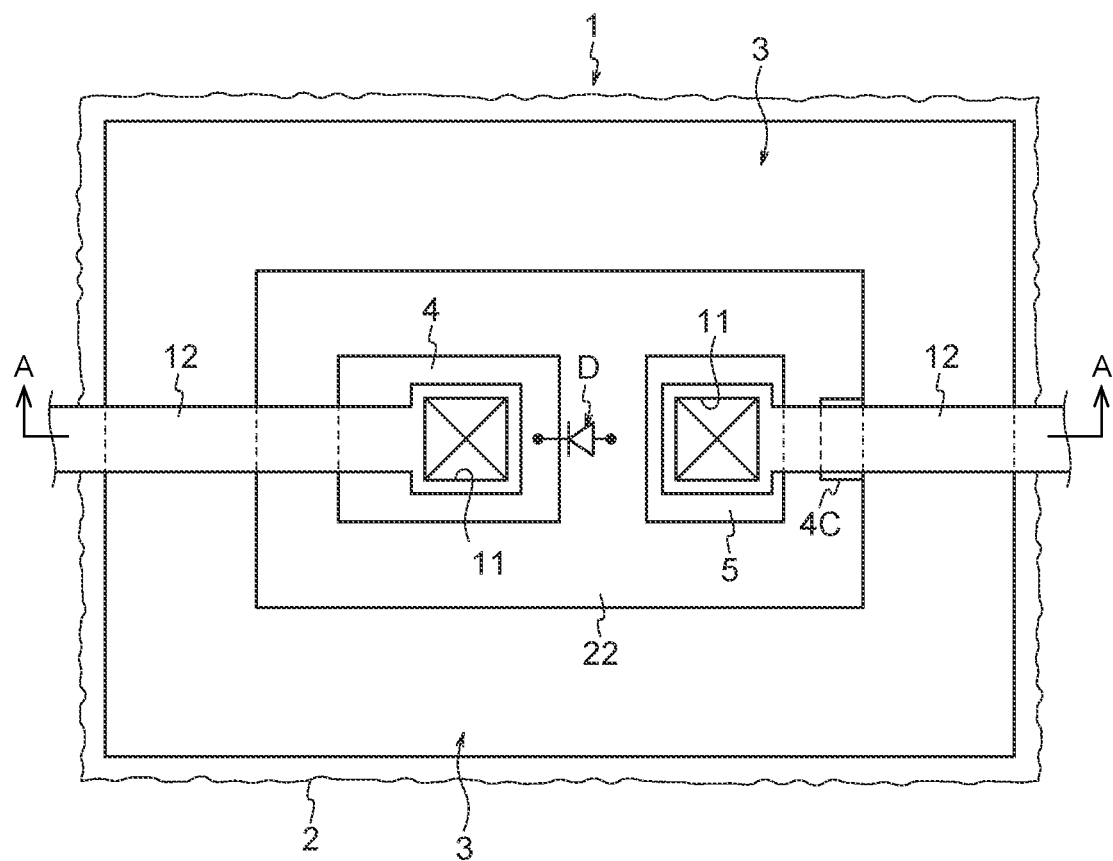
FIG. 2 is a plan view schematically illustrating an enlargement of relevant portions of the semiconductor device illustrated in FIG. 1.

Explanation follows regarding a semiconductor device and a manufacturing method thereof according to a first exemplary embodiment of the present invention, with reference to FIG. 1 and FIG. 2.

Semiconductor Device 1 Substrate Cross-Section Structure

As illustrated in FIG. 1 and FIG. 2, a semiconductor device 1 according to the present exemplary embodiment is principally configured by a substrate (a semiconductor pellet or a semiconductor chip) 2. A p-n junction diode D (hereafter simply referred to as the diode D), serving as a protected element, is arranged at a portion on a main face of the substrate 2. The diode D is electrically connected to an external terminal BP by connecting in the forward direction.

A SOI substrate is employed as the substrate 2. Namely, the substrate 2 has a structure of sequentially stacked layers of a conductive substrate-support 20, an insulation layer 21 formed on the substrate-support 20, and an active layer 22 formed on the insulation layer 21.

In this example, the substrate-support 20 is formed by a monocrystalline silicon substrate set as p-type with a low impurity concentration. Note that the substrate-support 20 may be set as p-type with a medium or high impurity concentration, or alternatively may be set as n-type.

The insulation layer 21 is formed by a buried oxide (BOX) film, and more specifically is formed by a silicon oxide film. The insulation layer 21 is for example formed using an ion implantation method in which oxygen is implanted into the substrate-support 20 so as to cause localized oxidation of silicon in the substrate-support 20.

In this example, the active layer 22 is, similarly to the substrate-support 20, formed by a monocrystalline silicon substrate set as p-type with a low impurity concentration. The active layer 22 is formed using part of a surface layer of the substrate-support 20, and forming the insulation layer 21 creates a partition (electrically isolates) between the active layer 22 and the substrate-support 20 about the insulation layer 21 as a boundary. The diode D is arranged in the active layer 22, and another circuit-configuring semiconductor element other than the diode D is also arranged in the active layer 22.

Examples of the semiconductor element include an insulated-gate field-effect transistor Tr (IGFET), a bipolar transistor, a resistor element, and a capacitor element. Note that use of the term IGFET encompasses both MOSFET and metal-insulator-semiconductor field-effect transistors (MISFET), and encompasses both n-channel conductivity and p-channel conductivity types thereof.

Element Isolation Region 3 Structure

As illustrated in FIG. 1 and FIG. 2, an element isolation region 3 configuring a region surrounding the periphery of the diode D is arranged in the active layer 22. The element isolation region 3 is configured so as to electrically isolate between elements, such as between the diode D and the semiconductor element other than the diode D arranged at the periphery of the diode D. In the present exemplary embodiment, the element isolation region 3 is configured including a trench 30, an insulation body 31, and a conductor 32, and is configured as what is referred to as a trench isolation structure.

The trench 30 surrounds the periphery of the diode D, and is configured so as to extend from the surface of the active layer 22 at least as far as the surface of the insulation layer 21. The trench 30 is set so as to have a smaller groove opening width dimension than its groove depth dimension (so as to have a large aspect ratio). Namely, adopting the element isolation region 3 including the trench 30 reduces the surface area occupied by the element isolation region 3 above the surface of the active layer 22, thereby enabling the integration density of the semiconductor device 1 to be improved. The trench 30 may be formed by anisotropic etching such as reactive-ion etching (RIE) during a manufacturing process of the semiconductor device 1.

The insulation body 31 is arranged at side walls of the trench 30, and is for example formed by a silicon oxide film. The silicon oxide film may for example be formed using a chemical vapor deposition (CVD) method.

The conductor 32 is filled inside of the trench 30 with the insulation body 31 interposed between the conductor 32 and the trench 30. For example, a polycrystalline silicon film may be employed as the conductor 32. The polycrystalline silicon film may be doped with impurities when need arises, such as when applied with a ground potential, so as to adjust the polycrystalline silicon film to a low resistance value. In the manufacturing process of the semiconductor device 1, a polycrystalline silicon film may for example be filled into the trench 30 by deposition using a CVD method until the polycrystalline silicon film configures a flat surface over the active layer 22. The polycrystalline silicon film over the active layer 22 is then removed, leaving the inside of the trench 30 completely filled. The removal of the polycrystalline silicon may be performed by employing an etching method or a chemical mechanical polishing (CMP) method.

Diode D Structure

As illustrated in FIG. 1 and FIG. 2, the diode D is configured by a p-n junction between the p-type active layer 22 serving as an anode region and an n-type semiconductor region 4 serving as a cathode region.

A bottom face of the active layer 22 serving as the anode region is surrounded by the insulation layer 21 (see FIG. 1), and side faces around the entire periphery of the active layer 22 are surrounded by the element isolation region 3 (see FIG. 1 and FIG. 2). There is no particular limitation to the planar profile of the active layer 22. As illustrated in FIG. 2, in this example, the active layer 22 is formed with a long and thin rectangular planar profile running along a left-right direction. More specifically, the n-type semiconductor region 4 serving as the cathode region and a contact region (p-type semiconductor region 5), described later, are arranged in the active layer 22 along the left-right direction. The active layer 22 is accordingly formed in a rectangular shape with its length direction along the left-right direction.

Note that as illustrated in FIG. 1, since the active layer 22 is employed as the anode region, a depth d1 of the anode region from the surface of the active layer 22 corresponds to the thickness of the active layer 22.

The n-type semiconductor region 4 is formed by introducing n-type impurities into the active layer 22 from the surface thereof using an ion implantation method or a solid phase diffusion method, and activating the n-type impurities. The impurity concentration of the n-type semiconductor region 4 is set with a higher impurity concentration than the impurity concentration of the active layer 22. A p-n junction depth d3 of the n-type semiconductor region 4 to the active layer 22 is set shallower than the depth d1 of the active layer 22.

The p-type semiconductor region 5 employed as the contact region with the same conductivity type as the active layer 22 is arranged on a portion on the main face of the active layer 22 serving as the anode region. The p-type semiconductor region 5 is set with a higher impurity concentration than the impurity concentration of the n-type semiconductor region 4. A depth d2 of the p-type semiconductor region 5 from the surface of the active layer 22 is set shallower than the p-n junction depth d3 of the n-type semiconductor region 4. In other words, the p-n junction depth d3 of the n-type semiconductor region 4 is set deeper than the depth d2 of the p-type semiconductor region 5.

Thus arranging the p-type semiconductor region 5 enables a reduction to be achieved in contact resistance (connection resistance) between the active layer 22, serving as the anode region, and wiring that is electrically connected thereto (wiring 12 illustrated in FIG. 1).

As illustrated in FIG. 1, a passivation film 10 is arranged over the entire surface of the substrate 2, including over the diode D and over the element isolation region 3. The passivation film 10 is for example formed of a monolayer configured by a silicon oxide film or a silicon nitride film, or a composite film formed by stacking these films together.

As illustrated in FIG. 1 and FIG. 2, the wiring 12 is arranged on the passivation film 10. Although the wiring 12 is illustrated as a monolayer wiring structure, a wiring structure of two or more layers may be employed. For example, an aluminum alloy film to which copper (Cu) and silicon (Si) has been added may be employed as the wiring 12.

One end portion of one line of the wiring 12 illustrated on the left side in FIG. 1 and FIG. 2 is electrically connected to the n-type semiconductor region 4 serving as the cathode region through a connection hole 11 formed penetrating the passivation film 10 in its film thickness direction. The other end portion of this wiring 12 extends over the active layer 22 with the passivation film 10 interposed therebetween, runs across the element isolation region 3, and is connected to internal circuitry, not illustrated in the drawings.

One end portion of another line of the wiring 12 illustrated on the right side therein is electrically connected to the p-type semiconductor region 5 through a connection hole 11, and the p-type semiconductor region 5 is electrically connected to the p-type active layer 22 serving as the anode region. The other end portion of this wiring 12 extends over the active layer 22 with the passivation film 10 interposed therebetween, runs across the element isolation region 3, and is connected to the external terminal BP, not illustrated in the drawings.

Channel Stopper Region 4C Structure

As illustrated in FIG. 1 and FIG. 2, in the semiconductor device 1 configured in this manner, a channel stopper region 4C is arranged on a portion on the main face of the p-type active layer 22 serving as the anode region.

More specifically, the channel stopper region 4C is located between the p-type semiconductor region 5 serving as the contact region and the element isolation region 3, and is arranged below the wiring 12 connected to the p-type semiconductor region 5 (the wiring on the right side in FIG. 1 and FIG. 2). Note that the channel stopper region 4C is isolated from the p-type semiconductor region 5 with the active layer 22 interposed therebetween, and is arranged so as to be in contact with the element isolation region 3. The channel stopper region 4C is also arranged so as to border a portion at the periphery of the p-type semiconductor region 5 not under the wiring 12 but located out from the wiring 12 in the width direction thereof. In the present exemplary embodiment, the channel stopper region 4C is arranged at least within a range from the wiring 12 that, when a negative surge voltage is applied to the wiring 12, is reached by an electric field effect at portions on the main face of the active layer 22 located away from the wiring 12 in the width direction thereof.

Note that the channel stopper region 4C may be arranged separated from the element isolation region 3.

The channel stopper region 4C is formed by an n-type semiconductor region of the opposite conductivity type to the active layer 22. The n-type semiconductor region is set with a lower impurity concentration than the impurity concentration of the p-type semiconductor region 5 serving as the contact region, and is set with a deeper p-n junction depth d3 than the depth d2 of the p-type semiconductor region 5. Moreover, the n-type semiconductor region is set with a higher impurity concentration than the impurity concentration of the active layer 22 serving as the anode region, and is set with a shallower p-n junction depth d3 than the depth d1 of the active layer 22.

In the present exemplary embodiment, the channel stopper region 4C is set with the same impurity concentration as the impurity concentration of the n-type semiconductor region 4 serving as the cathode region, and is set with the same p-n junction depth d3 as the p-n junction depth d3 of the n-type semiconductor region 4.

Semiconductor Device 1 Manufacturing Method

A description follows regarding a manufacturing method of the semiconductor device 1 according to the present exemplary embodiment, and in particular a manufacturing method of the channel stopper region 4C.

Figure 3:
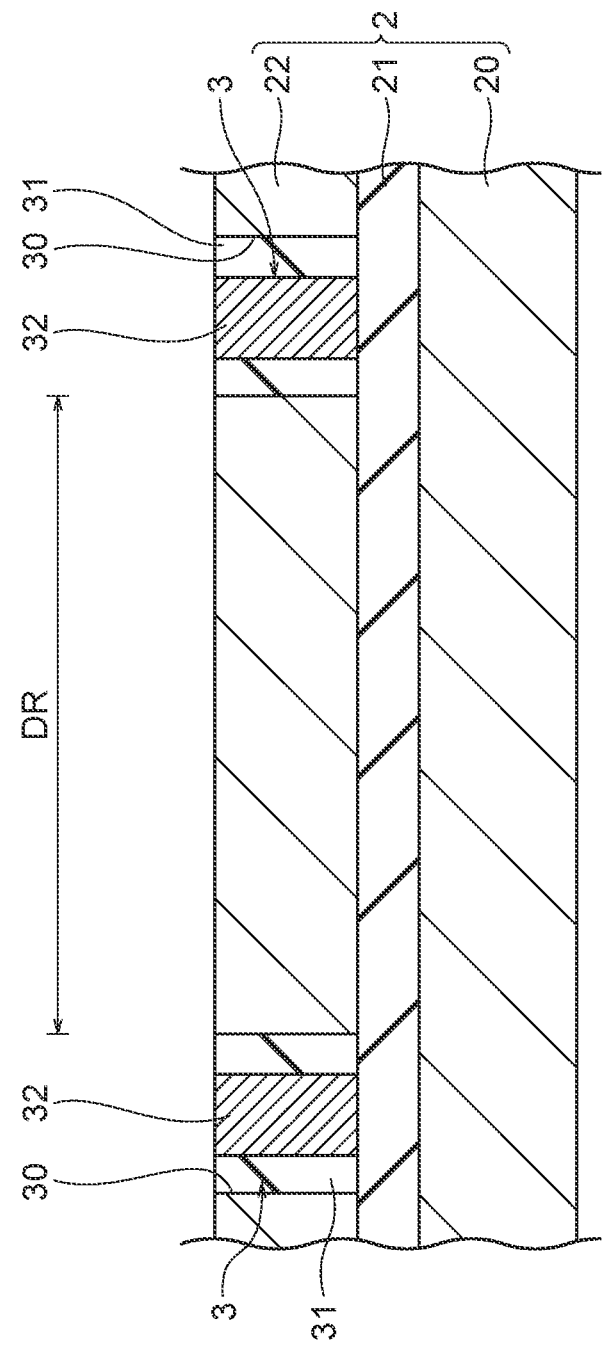
FIG. 3 is a first process cross-section to explain a manufacturing method of a semiconductor device according to the first exemplary embodiment.

First, the substrate 2 is prepared (see FIG. 3). An SOI substrate is employed as the substrate 2, and the substrate 2 includes the active layer 22 on the substrate-support 20, with the insulation layer 21 interposed therebetween. The active layer 22 is set to p-type, and is set with a low impurity concentration.

As illustrated in FIG. 3, the element isolation region 3 is formed in the active layer 22 so as to surround the periphery of a forming region DR for the diode D. First, the trench 30 of the element isolation region 3 is formed using photolithography or etching technology. Next, the insulation body 31 is formed at least along the side walls of the trench 30. The conductor 32 is then filled in the trench 30 so as to form the element isolation region 3 thereby.

When the element isolation region 3 has been formed, the periphery of the active layer 22 is surrounded by the element isolation region 3 at the forming region DR, such that the peripherally surrounded active layer 22 forms the anode region. Namely, a process to form the element isolation region 3 is incorporated in the manufacturing method of the semiconductor device 1 according to the present exemplary embodiment, after a process to form the active layer 22 serving as the anode region.

Alternatively, if an anode region were to be formed at the forming region DR alone, such an anode region would be formed in the same process as the process to form the element isolation region 3 in this manufacturing method.

Note that the anode region may be formed after the process to form the element isolation region 3 by first forming the active layer 22 and the element isolation region 3, and then implanting the active layer 22 with p-type impurities set with an appropriate impurity concentration.

Figure 4:
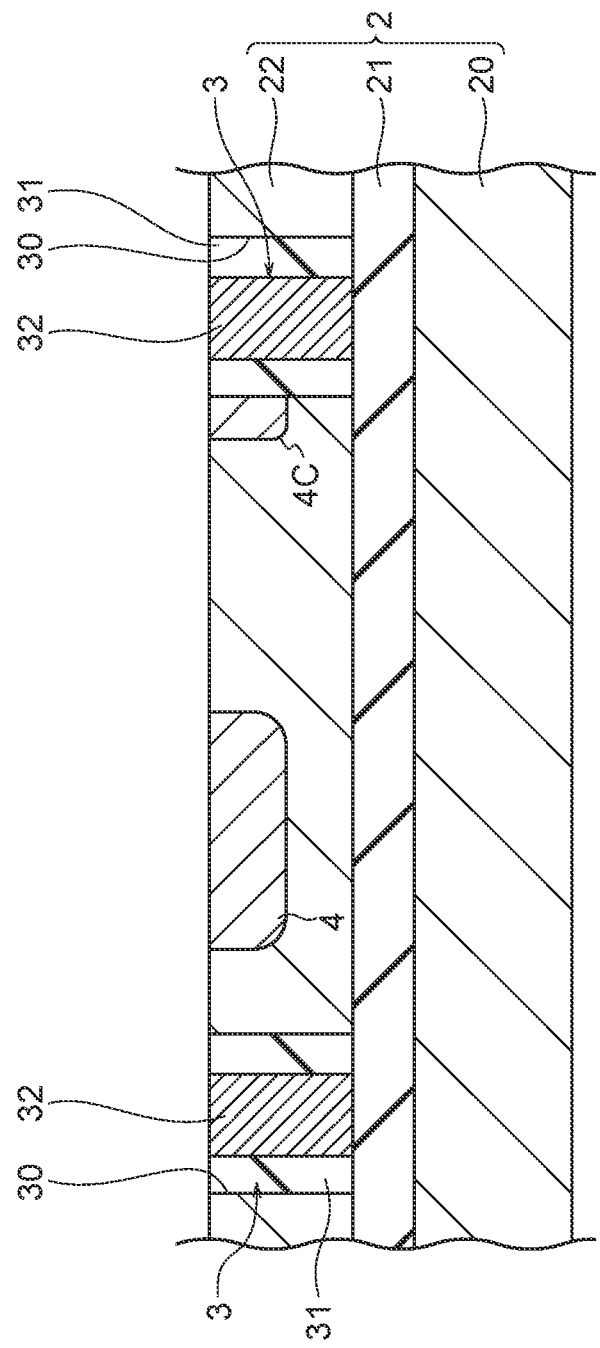
FIG. 4 is a second process cross-section to explain a manufacturing method of a semiconductor device.

As illustrated in FIG. 4, in the forming region DR, n-type impurities are introduced into a portion on the main face of the active layer 22 so as to form the n-type semiconductor region 4 serving as the cathode region. The n-type semiconductor region 4 is formed by introducing n-type impurities using an ion implantation method or a solid phase diffusion method employing a mask formed by photolithography, omitted from illustration, and activating the n-type impurities. When the n-type semiconductor region 4 has been formed, the diode D is effectively complete.

As illustrated in FIG. 4, in the manufacturing method of the semiconductor device 1 according to the present exemplary embodiment, the channel stopper region 4C is formed in the same process as the process to form the n-type semiconductor region 4. The channel stopper region 4C is formed on a portion on the main face of the active layer 22 located under the wiring 12 and between a forming region for the contact region (p-type semiconductor region 5) and the element isolation region 3. The channel stopper region 4C is formed as an n-type semiconductor region using the same mask and the same n-type impurity introduction conditions as the n-type semiconductor region 4. Namely, the channel stopper region 4C is formed with the same impurity concentration as the n-type semiconductor region 4, and is formed with the same p-n junction depth d3 as the p-n junction depth d3 of the n-type semiconductor region 4.

Figure 5:
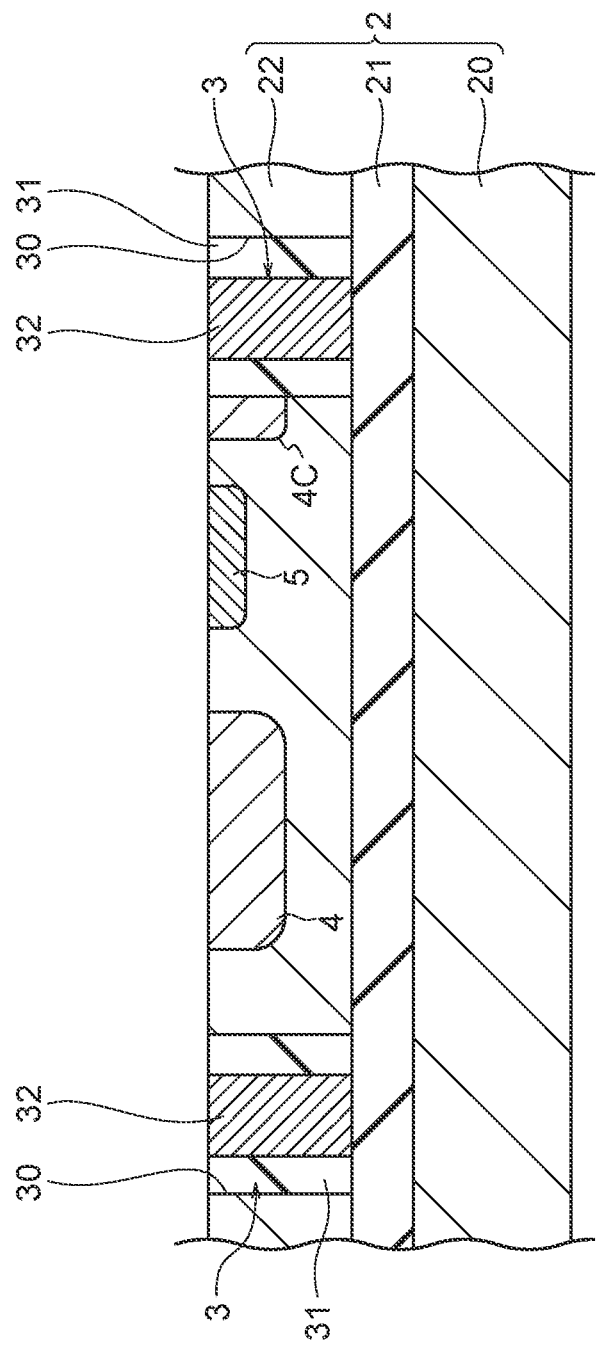
FIG. 5 is a third process cross-section to explain a manufacturing method of a semiconductor device.

As illustrated in FIG. 5, the p-type semiconductor region 5 serving as the contact region is formed in the forming region DR on a portion on the main face of the active layer 22. Similarly to the process in which the n-type semiconductor region 4 is formed, the p-type semiconductor region 5 is formed by introducing p-type impurities employing a non-illustrated mask, and activating the p-type impurities. The p-type semiconductor region 5 is formed between the n-type semiconductor region 4 and the channel stopper region 4C.

Next, the passivation film 10 is formed above the diode D and over the active layer 22, and over the element isolation region 3. The connection holes 11 are then formed in the passivation film 10 above the n-type semiconductor region 4 and above the p-type semiconductor region 5 (see FIG. 1).

Next, one end portion of one line of the wiring 12 to be connected to the n-type semiconductor region 4 through one connection hole 11, and one end portion of another line of the wiring 12 to be connected to the p-type semiconductor region 5 through the other connection hole 11, are respectively formed on the passivation film 10.

Although illustration and explanation is omitted, upper layer wiring, a final passivation film, and so on are then formed.

When this series of manufacturing processes has ended, the semiconductor device 1 according to the present exemplary embodiment, provided with a protected element configured including the diode D, is then complete.

Operation and Advantageous Effects of Present Exemplary Embodiment

As illustrated in FIG. 1 and FIG. 2, the semiconductor device 1 according to the present exemplary embodiment includes the protected element and the element isolation region 3 provided to the substrate 2.

The substrate 2 includes the conductive substrate-support 20, the insulation layer 21 on the substrate-support 20, and the active layer 22 on the insulation layer 21. The protected element is arranged in the active layer 22 and is configured including the diode D formed at the p-n junction between the anode region and the cathode region. The element isolation region 3 is arranged in the active layer 22 so as to surround the periphery of the diode D. The element isolation region 3 electrically isolates the diode D from an element arranged at the periphery of the diode D.

The p-type semiconductor region 5 serving as the contact region is also arranged at a portion on the main face of the active layer 22 serving as the anode region, and the one end portion of the wiring 12 is connected to the p-type semiconductor region 5. The p-type semiconductor region 5 is set with the same conductivity type as the anode region, and is set with a higher impurity concentration than the anode region. The wiring 12 is arranged above the diode D with the passivation film 10 interposed therebetween, and the other end portion of this wiring 12 extends over the passivation film 10.

Note that the semiconductor device 1 further includes the channel stopper region 4C. The channel stopper region 4C is arranged on a portion on the main face of the active layer 22 that is at least under the wiring 12 between the p-type semiconductor region 5 and the element isolation region 3. The channel stopper region 4C is set with the opposite conductivity type to the p-type semiconductor region 5.

Supposing a negative surge voltage were to be applied to the anode region (p-type active layer 22) through the wiring 12. An accumulation layer would normally be generated at a portion on the main face of the anode region located under the wiring 12 between the contact region (p-type semiconductor region 5) and the element isolation region 3 by the electric field effect from the wiring 12. However, in the present exemplary embodiment, the channel stopper region 4C is arranged under the wiring 12, enabling the generation of such an accumulation layer to be effectively suppressed or prevented by the channel stopper region 4C.

More specifically, as illustrated in FIG. 1, first, when a surge voltage is applied, a depletion layer In spreads toward the cathode region side from the p-n junction between the cathode region (n-type semiconductor region 4) and the anode region (p-type active layer 22).

A depletion layer Ip also spreads toward the anode region side from the p-n junction. Note that for example a ground potential (0V) is respectively applied to the substrate-support 20 of the substrate 2 and the conductor 32 of the element isolation region 3. As a result, the substrate-support 20, the insulation layer 21, and the active layer 22 of the substrate 2 configure a field plate structure, and furthermore the conductor 32 and the insulation body 31 of the element isolation region 3 together with the active layer 22 similarly configure a field plate structure. This enables the spreading of the depletion layer Ip to be increased.

Moreover, generation of an accumulation layer at the portion of the main face of the anode region under the wiring 12 is effectively suppressed or prevented by the channel stopper region 4C arranged thereat, thereby enabling promotion of spreading of the depletion layer Ip from the element isolation region 3 toward the contact region 2. This enables an increase to be achieved in the junction withstand voltage of the diode D with respect to surge voltage.

Furthermore, the junction withstand voltage of the diode D can be increased by a simple configuration in which the channel stopper region 4C is simply arranged under the wiring 12 at the main face portion of the anode region.

Figure 6:
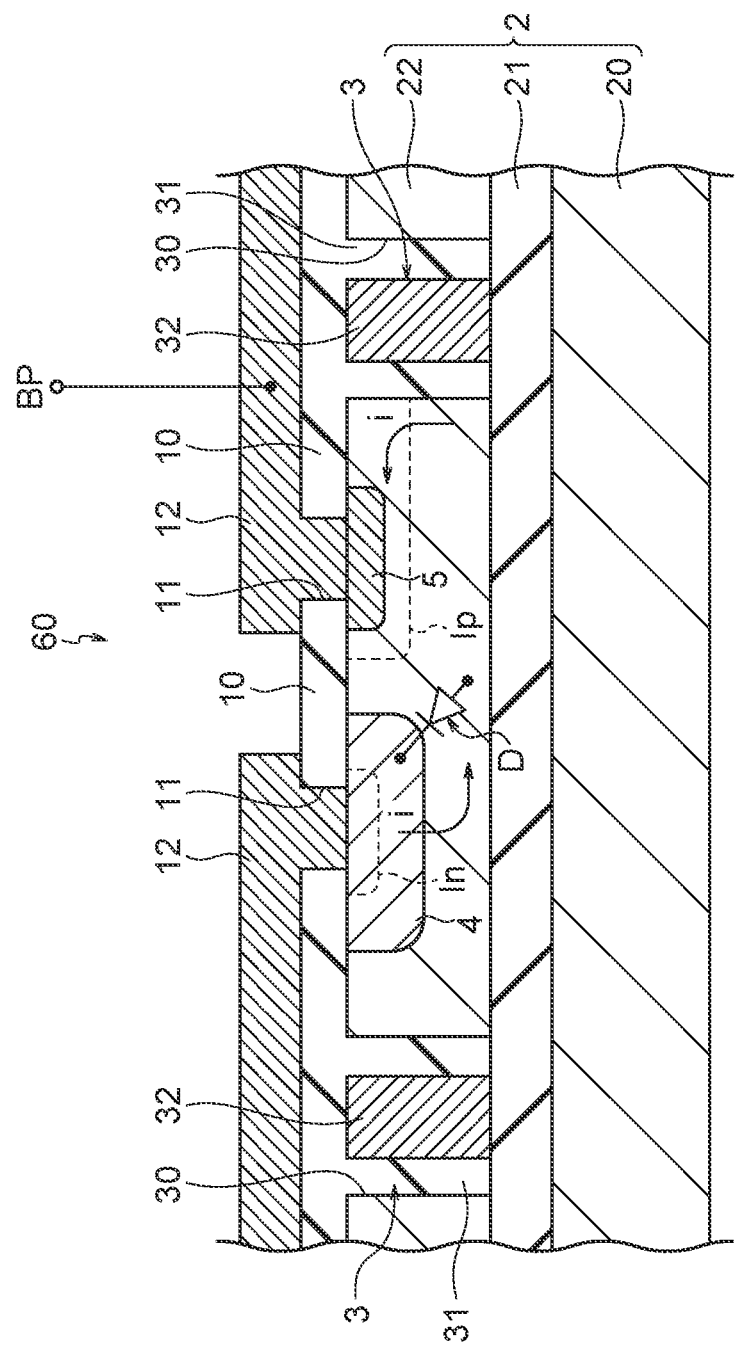
FIG. 6 is a vertical cross-section structural diagram corresponding to FIG. 1 and illustrating a semiconductor device according to a comparative example.

FIG. 6 illustrates a semiconductor device 60 according to a comparative example not provided with the channel stopper region 4C of the present exemplary embodiment. In the semiconductor device 60 according to the comparative example, when a negative surge voltage is applied to the anode region through the wiring 12, the depletion layer In spreads toward the cathode region side from the p-n junction between the cathode region and the anode region. The depletion layer Ip also spreads toward the anode region side from the p-n junction.

However, an accumulation layer is generated by the electric field effect from the wiring 12 at a portion on the main face of the anode region, in particular between the contact region (p-type semiconductor region 5) and the element isolation region 3, resulting in a region being generated where the depletion layer Ip does not spread. Thus, in the semiconductor device 60 illustrated in FIG. 6, the depletion layer Ip in the anode region does not spread from the element isolation region 3 toward the contact region. Thus, a surge current i flowing into the active layer 22 from the cathode region flows along a current path running along an interface between the active layer 22 and the insulation layer 21, and also along the trench 30 of the active layer 22 at an interface between the active layer 22 and the insulation body 31. The surge current i flows into the contact region as a result, meaning that the junction withstand voltage of the diode D is not able to be increased.

In the semiconductor device 1 according to the present exemplary embodiment, the current path in the semiconductor device 60 according to the comparative example illustrated in FIG. 6 is effectively eliminated by including the channel stopper region 4C, thereby enabling an increase to be achieved in the junction withstand voltage of the diode D.

Moreover, as illustrated in FIG. 2, in the semiconductor device 1 according to the present exemplary embodiment, the channel stopper region 4C is also arranged at a portion bordering the periphery of the contact region (p-type semiconductor region 5) not under the wiring 12.

Thus, even were the electric field effect to spread in the width direction of the wiring 12, generation of an accumulation layer at the portion on the main face of the anode region in the region where this electric field effect has spread could be effectively suppressed or prevented compared to cases in which the channel stopper region 4C is only arranged under the wiring 12. Thus, spreading of the depletion layer Ip from the element isolation region 3 toward the contact region can also be achieved even at a location not under the wiring 12, thereby enabling a still further increase to be achieved in the junction withstand voltage of the diode D.

Furthermore, as illustrated in FIG. 1, in the semiconductor device 1 according to the present exemplary embodiment, the impurity concentration of the channel stopper region 4C is set lower than the impurity concentration of the contact region (p-type semiconductor region 5), such that the junction depth d3 of the channel stopper region 4C to the anode region (active layer 22) is easily set deeper than the depth d2 of the contact region.

On the other hand, the impurity concentration of the channel stopper region 4C is set higher than the impurity concentration of the anode region, such that the junction depth d3 of the channel stopper region 4C is easily set shallower than the depth d1 of the anode region.

This enables the channel stopper region 4C to be formed in a region running along a side face on the anode region side of the element isolation region 3 at a depth deeper than the depth d2 of the contact region, enabling the in this deeper region depletion layer Ip to spread. This enables the junction withstand voltage of the diode D to be still further increased.

Moreover, as illustrated in FIG. 1, in the semiconductor device 1 according to the present exemplary embodiment, the junction depth d3 of the channel stopper region 4C to the anode region (active layer 22) is set deeper than the depth d2 from the main face of the contact region (p-type semiconductor region 5).

Thus, the channel stopper region 4C is formed in the region running along the side face on the anode region side of the element isolation region 3 at a depth deeper than the depth d2 of the contact region, enabling the depletion layer Ip in this deeper region to spread. This enables the junction withstand voltage of the diode D to be still further increased.

Furthermore, as illustrated in FIG. 1 and FIG. 4, in the semiconductor device 1 according to the present exemplary embodiment, the impurity concentration of the channel stopper region 4C is set to the same impurity concentration as the cathode region (n-type semiconductor region 4). In addition thereto, the junction depth d3 of the channel stopper region 4C to the anode region (active layer 22) is set the same as the junction depth d3 of the cathode region to the anode region.

This enables the channel stopper region 4C to be simply configured with the same structure as the cathode region, thereby enabling the junction withstand voltage of the diode D to be improved in a simple manner.

Moreover, in the manufacturing method of the semiconductor device 1 according to the present exemplary embodiment, first, as illustrated in FIG. 3, the element isolation region 3 is formed in the substrate 2, and the anode region of the diode D configuring the protected element is formed. The substrate 2 includes the substrate-support 20, the insulation layer 21 on the substrate-support 20, and the active layer 22 on the insulation layer 21. The element isolation region 3 is formed in the active layer 22 so as to surround the forming region DR for the diode D. The anode region is formed to the periphery of the p-type active layer 22 surrounded by the element isolation region 3.

Next, as illustrated in FIG. 4, the cathode region is formed to a portion on the main face of the anode region so as to form the diode D including the anode region and the cathode region. The cathode region is set with the opposite conductivity type to the anode region, and is formed by the n-type semiconductor region 4.

As illustrated in FIG. 5, the contact region is formed to a different portion of the main face of the anode region to the portion formed with the cathode region. The contact region is formed by the p-type semiconductor region 5 set with the same conductivity type as the anode region, and the impurity concentration of the contact region is set higher than the impurity concentration of the anode region.

Next, as illustrated in FIG. 1, the wiring 12 is formed above the diode D with the passivation film 10 interposed therebetween. As illustrated in FIG. 1 and FIG. 2, the one end portion of this wiring 12 is connected to the contact region, and the other end portion of this wiring 12 extends over the passivation film 10.

Note that the channel stopper region 4C is formed on a portion on the main face of the anode region (active layer 22) so as to be located under the wiring 12 between the contact region (p-type semiconductor region 5) and the element isolation region 3. The channel stopper region 4C is formed with the same conductivity type as the cathode region (n-type semiconductor region 4) by the same process as the process to form the cathode region.

Thus, the channel stopper region 4C is formed by utilizing the process to form the cathode region, thereby enabling the number of manufacturing processes to be reduced by the elimination of an extra process to form the channel stopper region 4C. Moreover, the junction withstand voltage of the diode D can be increased.

Second Exemplary Embodiment

Figure 7:
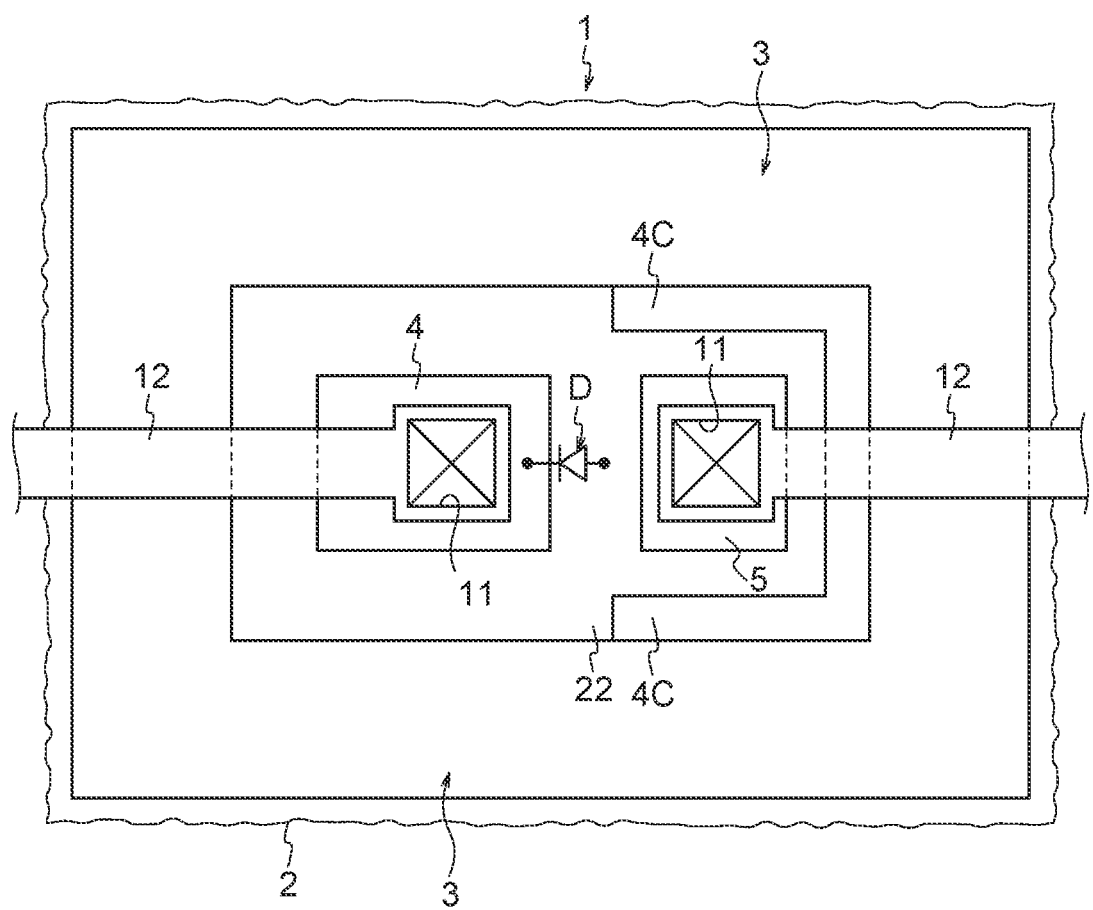
FIG. 7 is a plan view corresponding to FIG. 2 and schematically illustrating an enlargement of relevant portions of a semiconductor device according to a second exemplary embodiment of the present invention.

Next, explanation follows regarding a semiconductor device 1 and a manufacturing method thereof according to a second exemplary embodiment of the present invention, with reference to FIG. 7. Note that in the present exemplary embodiment and in subsequent exemplary embodiments, described later, configuration elements that are the same or basically the same as configuration elements in the semiconductor device 1 according to first exemplary embodiment are appended with the same reference numerals, and duplicate explanation thereof is omitted.

As illustrated in FIG. 7, in the semiconductor device 1 according to the present exemplary embodiment, the channel stopper region 4C is also arranged at a portion on the main face of the active layer 22 serving as the anode region so as to border a portion of the periphery of the contact region not under the wiring 12.

More specifically, in plan view, the channel stopper region 4C is arranged bordering a portion of the periphery of the contact region (p-type semiconductor region 5) formed in a rectangular shape, excluding at an edge portion on the cathode region side of the contact region. Namely, in FIG. 7, the channel stopper region 4C extends along an upper edge, a lower edge of the contact region, and along a right edge of the contact region on the opposite side to the cathode region, so as to be arranged bordering approximately three quarters of the periphery of the contact region.

The manufacturing method of the semiconductor device 1, including manufacturing of the channel stopper region 4C, is similar to the manufacturing method of the semiconductor device 1 according to the first exemplary embodiment previously described, and so explanation thereof is omitted here.

The semiconductor device 1 configured in this manner and the manufacturing method thereof are capable of obtaining similar operation and advantageous effects to the operation and advantageous effects obtained by the semiconductor device 1 and manufacturing method thereof according to the first exemplary embodiment previously described.

Furthermore, as illustrated in FIG. 7, in the semiconductor device 1 according to the present exemplary embodiment, the channel stopper region 4C is also arranged bordering a portion of the periphery of the contact region not under the wiring 12, this portion being on the main face of the anode region and excluding a location opposing the cathode region.

Thus, even were the other end portion of the wiring 12 having one end portion connected to the contact region (p-type semiconductor region 5) to be laid out so as to extend in an up-down direction in FIG. 7, the channel stopper region 4C would always be arranged under the wiring 12 at the main face portion of the anode region. Namely, the degrees of freedom of the wiring layout can be increased while also being able to increase the junction withstand voltage of the diode D.

Third Exemplary Embodiment

Figure 8:
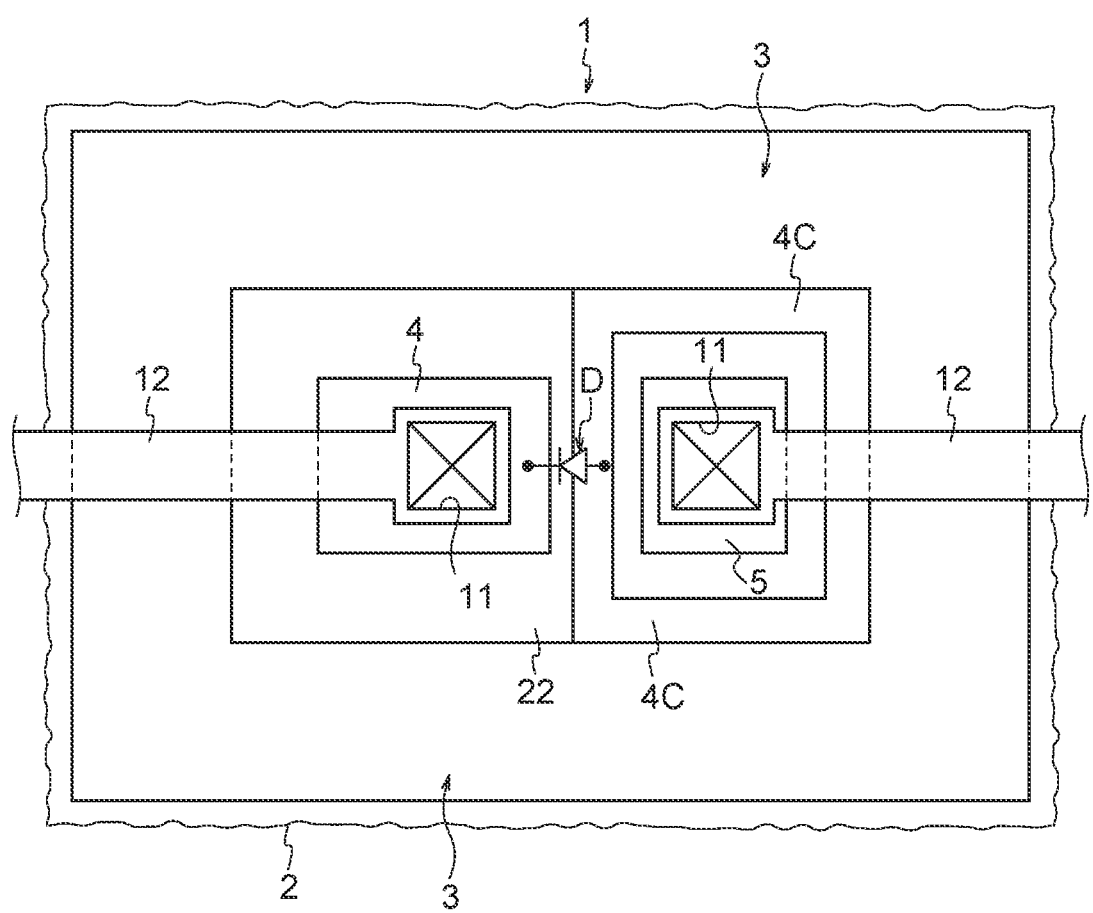
FIG. 8 is a plan view corresponding to FIG. 2 and schematically illustrating an enlargement of relevant portions of a semiconductor device according to a third exemplary embodiment of the present invention.

Next, explanation follows regarding a semiconductor device 1 and a manufacturing method thereof according to a third exemplary embodiment of the present invention, with reference to FIG. 8. The present exemplary embodiment is a modified example of the semiconductor device 1 and manufacturing method thereof according to the second exemplary embodiment.

As illustrated in FIG. 8, in the semiconductor device 1 according to the present exemplary embodiment, the channel stopper region 4C is also arranged at a portion not under the wiring 12 on the main face of the active layer 22 serving as the anode region so as to surround the entire periphery of the contact region.

More specifically, in plan view, the channel stopper region 4C is formed in an endless rectangular frame shape around all the edge portions of the rectangular contact region (p-type semiconductor region 5).

The manufacturing method of the semiconductor device 1 including manufacturing of the channel stopper region 4C is similar to the manufacturing method of the semiconductor device 1 according to the first exemplary embodiment previously described, and so explanation thereof is omitted here.

The semiconductor device 1 configured in this manner and the manufacturing method thereof are capable of obtaining similar operation and advantageous effects to the operation and advantageous effects obtained by the semiconductor device 1 and manufacturing method thereof according to the second exemplary embodiment previously described.

Furthermore, as illustrated in FIG. 8, in the semiconductor device 1 according to the present exemplary embodiment, the channel stopper region 4C is arranged at a portion on the main face of the anode region located between the cathode region (n-type semiconductor region 4) and the contact region (p-type semiconductor region 5). The channel stopper region 4C extends from the main face of the active layer 22 in a depth direction, and acts as a wall that prevents spreading of the depletion layer Ip (see FIG. 1) in a lateral direction toward the contact region side from the p-n junction between the cathode region and the anode region.

The depletion layer Ip accordingly detours in the depth direction of the active layer 22 along the channel stopper region 4C, enabling spreading of the depletion layer Ip to be promoted. The junction withstand voltage of the diode D can accordingly be increased still further.

Fourth Exemplary Embodiment

Figure 9:
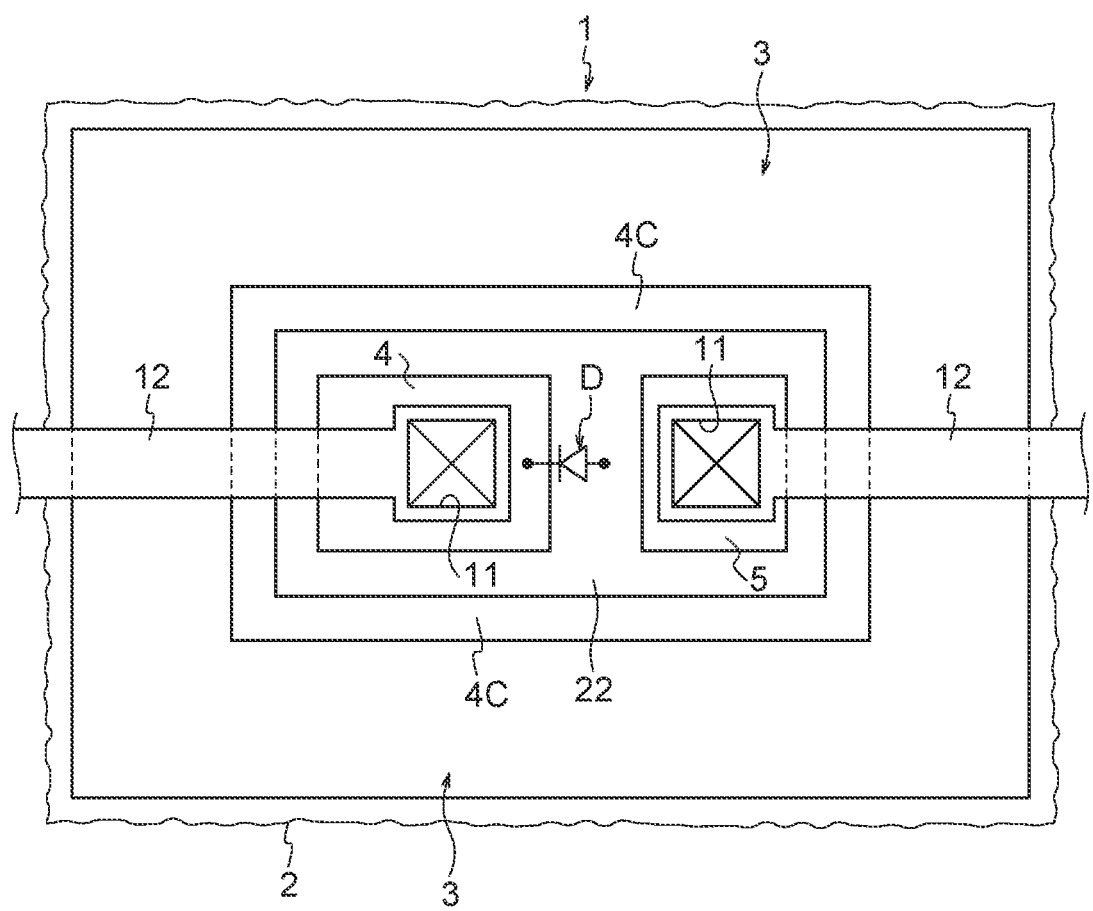
FIG. 9 is a plan view corresponding to FIG. 2 and schematically illustrating an enlargement of relevant portions of a semiconductor device according to a fourth exemplary embodiment of the present invention.

Next, explanation follows regarding a semiconductor device 1 and a manufacturing method thereof according to a fourth exemplary embodiment of the present invention, with reference to FIG. 9. The present exemplary embodiment is a modified example of the semiconductor device 1 and manufacturing method thereof according to the second exemplary embodiment.

As illustrated in FIG. 9, in the semiconductor device 1 according to the present exemplary embodiment, the channel stopper region 4C is also arranged not under the wiring 12 at a portion on the main face of the active layer 22 serving as the anode region so as to surround the periphery of the contact region and the cathode region.

More specifically, in plan view as illustrated in FIG. 9, the channel stopper region 4C extends along a right edge, an upper edge, and a lower edge of the contact region (p-type semiconductor region 5) formed in a rectangular shape. The channel stopper region 4C also extends along a left edge, an upper edge, and a lower edge of the cathode region (n-type semiconductor region 4) formed in a rectangular shape. The channel stopper region C is formed in a continuous rectangular frame shape and is not formed at a location between the cathode region and the contact region.

The manufacturing method of the semiconductor device 1 including manufacturing of the channel stopper region 4C is similar to the manufacturing method of the semiconductor device 1 according to the first exemplary embodiment previously described, and so explanation thereof is omitted here.

The semiconductor device 1 configured in this manner and the manufacturing method thereof are capable of obtaining similar operation and advantageous effects to the operation and advantageous effects obtained by the semiconductor device 1 and manufacturing method thereof according to the second exemplary embodiment previously described.

Furthermore, in the semiconductor device 1 according to the present exemplary embodiment, even were the other end portion of the wiring 12 having one end portion connected to the contact region (p-type semiconductor region 5) to be laid out so as to extend in an up-down direction and a left-right direction in FIG. 9, the channel stopper region 4C would always be arranged under the wiring 12 at a portion on the main face of the anode region. Namely, the degrees of freedom of the wiring layout can be increased while also being able to increase the junction withstand voltage of the diode D.

Note that the present invention may be configured by a combination of the semiconductor device 1 according to the present exemplary embodiment and the semiconductor device 1 according to the third exemplary embodiment previously described. Namely, the channel stopper region 4C may be arranged between the cathode region and the contact region as illustrated in FIG. 8 in addition to the arrangement of the channel stopper region 4C illustrated in FIG. 9.

Supplementary Explanation of Above Exemplary Embodiments

The present invention is not limited to the above exemplary embodiments, and for example modifications such as those described below may be implemented within a range not departing from the spirit of the present invention.

In the substrate of the semiconductor device of the present invention, the substrate-support is not limited to being a monocrystalline silicon substrate, and a metal substrate, a compound semiconductor substrate, or the like may be employed therefor.

Moreover, in the present invention any element including a p-n junction diode may be employed as the protected element, such as an IGFET, a bipolar transistor, or a diffusion resistor. Specifically, a diode is formed at the p-n junction between one main electrode of an IGFET and the active layer. In cases in which a bipolar transistor is employed, a diode is formed at the p-n junction between a base region (active layer) and an emitter region or a collector region. In cases in which a diffusion resistor is employed, a diode is formed at the p-n junction between the diffusion resistor and the active layer.

Furthermore, in the present invention, a protected element may be constructed by two or more elements, such as a combination of a diode and an IGFET, or a combination of a diffusion resistor and an IGFET.

Furthermore, although the element isolation region has a trench isolation structure in the present exemplary embodiment, a field insulation film formed using technology to selectively oxidize a substrate may be employed as the element isolation region in the present invention.

The entire content of the disclosure of Japanese Patent Application No. 2018-135262 filed on Jul. 18, 2018 is incorporated by reference in the present specification.

The invention claimed is:

1. A semiconductor device comprising:
a protected element that is configured to include a p-n junction diode between an anode region and a cathode region, and arranged in an active layer of a substrate including the active layer formed over a substrate-support with an insulation layer interposed between the active layer and the substrate-support;
an element isolation region that is arranged in the active layer so as to surround a periphery of the p-n junction diode and to electrically isolate the p-n junction diode from an element arranged at the periphery of the p-n junction diode;
a contact region that is arranged at a portion on a main face of the anode region, set with a same conductivity type as the anode region, and set with a higher impurity concentration than the anode region;
wiring arranged above the p-n junction diode with a passivation film between the p-n junction diode and the wiring, one end portion of the wiring being connected to the contact region and another end portion of the wiring extending over the passivation film; and
a channel stopper region that is arranged at another portion on the main face of the anode region under the wiring between the contact region and the element isolation region, and set with an opposite conductivity type to the contact region,
wherein the channel stopper region is set with a lower impurity concentration than an impurity concentration of the contact region, and is set with a higher impurity concentration than an impurity concentration of the anode region.

2. The semiconductor device of claim 1, wherein a junction depth of the channel stopper region formed with the anode region is set deeper than a junction depth of the contact region formed with the anode region.

3. The semiconductor device of claim 1, wherein:
an impurity concentration of the channel stopper region is set the same as an impurity concentration of the cathode region, and
a junction depth of the channel stopper region formed with the anode region is set the same as a junction depth of the cathode region formed with the anode region.

4. A semiconductor device comprising:
a protected element that is configured to include a p-n junction diode between an anode region and a cathode region, and arranged in an active layer of a substrate including the active layer formed over a substrate-support with an insulation layer interposed between the active layer and the substrate-support;
an element isolation region that is arranged in the active layer so as to surround a periphery of the p-n junction diode and to electrically isolate the p-n junction diode from an element arranged at the periphery of the p-n junction diode;
a contact region that is arranged at a portion on a main face of the anode region, set with a same conductivity type as the anode region, and set with a higher impurity concentration than the anode region;
wiring arranged above the p-n junction diode with a passivation film between the p-n junction diode and the wiring, one end portion of the wiring being connected to the contact region and another end portion of the wiring extending over the passivation film; and
a channel stopper region that is arranged at another portion on the main face of the anode region under the wiring between the contact region and the element isolation region, and set with an opposite conductivity type to the contact region,
wherein a junction depth of the channel stopper region formed with the anode region is set deeper than a junction depth of the contact region formed with the anode region.

5. A semiconductor device comprising:
a protected element that is configured to include a p-n junction diode between an anode region and a cathode region, and arranged in an active layer of a substrate including the active layer formed over a substrate-support with an insulation layer interposed between the active layer and the substrate-support;
an element isolation region that is arranged in the active layer so as to surround a periphery of the p-n junction diode and to electrically isolate the p-n junction diode from an element arranged at the periphery of the p-n junction diode;
a contact region that is arranged at a portion on a main face of the anode region, set with a same conductivity type as the anode region, and set with a higher impurity concentration than the anode region;
wiring arranged above the p-n junction diode with a passivation film between the p-n junction diode and the wiring, one end portion of the wiring being connected to the contact region and another end portion of the wiring extending over the passivation film; and
a channel stopper region that is arranged at a portion on the main face of the anode region under the wiring between the contact region and the element isolation region, and set with an opposite conductivity type to the contact region,
wherein an impurity concentration of the channel stopper region is set the same as an impurity concentration of the cathode region, and
wherein a junction depth of the channel stopper region formed with the anode region is set the same as a junction depth of the cathode region formed with the anode region.

* * * * *